United States Patent [19]

Balchunas

[11] Patent Number: 4,751,524

[45] Date of Patent: Jun. 14, 1988

[54] CONSTANT POWER LASER DRIVER

[75] Inventor: Ted G. Balchunas, Huntington Station, N.Y.

[73] Assignee: Data Recording Systems, Inc., Melville, N.Y.

[21] Appl. No.: 5,038

[22] Filed: Jan. 20, 1987

[51] Int. Cl.[4] ............................ G01D 9/42; H01S 3/00
[52] U.S. Cl. ........................................ 346/108; 372/38
[58] Field of Search ................. 346/107 R, 108, 76 L, 346/1.1; 372/29, 31, 38

[56] References Cited

U.S. PATENT DOCUMENTS 4,423,409 12/1983 Naylor ............................ 307/299 A Primary Examiner—E. A. Goldberg
Assistant Examiner—Mark Reinhart
Attorney, Agent, or Firm—Darby & Darby

[57] ABSTRACT

A constant power laser driver for a laser diode in a laser printer reduces laser shadow by maintaining the junction temperature of the laser diode at a constant level. The constant temperature is maintained by a reverse or zener current through the laser diode when the laser is in an off state. The zener current is determined so that the product of the reverse laser current and reverse breakdown voltage is equal to the product of the forward bias voltage drop and forward current when the laser is on. Since these products are substantially equal to the current dissipated in the diode, equal amounts of power are dissipated as heat in the laser diode junction both when the laser is in a writing state and in a non-writing state. As a result, the junction temperature remains relatively constant and the light output remains constant when the laser is turned on, regardless of the length of time it was previously in the opposite state.

14 Claims, 2 Drawing Sheets

CONSTANT POWER LASER DRIVER

BACKGROUND OF THE INVENTION

1. Field of the Invention

This invention relates to laser printers and, more particularly, to a constant power driver for a laser diode of a laser printer, which driver operates to eliminate laser shadow on a printed page.

2. Description of the Prior Art

Laser printers are utilized to provide high quality hard copy of computer generated documents at high speed and moderate to high resolutions. The most advanced of laser printers can provide both high resolution and high speed.

Basically, a laser printer is a relative of the common office electrophotographic copier. The light output of a laser diode is modulated by graphics or text data from a computer. An optical lens system is used to focus the light beam output to a spot on a photosensitive surface similar to the photoconductor drum of the electrophotographic copier. The spot is caused to sweep across the photosensitive surface in a raster fashion by a rotating and/or oscillating mirror. Computer or video raster information modulates the light beam as the photosensitive surface moves in a direction perpendicular to and under the sweeping light beam. The sweeping and modulated light beam causes the formation of an electrostatic charge image on the drum. This image can then be developed using a toner and transferred to paper. The toner is then fused to the paper, usually with heat and pressure as in a conventional electrophotographic copier. An example of such a laser printer is disclosed in U.S. Pat. No. 3,867,571 of Starkweather, et al.

The laser diode in a laser printer is, as its name implies, a semiconductor device and generally includes P and N regions which may have a dielectric waveguide therebetween. The dielectric waveguide generally has two parallel, polished ends, between which radiation is reflected. The rear surface includes a layer of a highly reflective metal, whereas the front surface transmits light and may be merely the cleaved end of a crystal.

The fundamental light-producing mechanism in the semiconductor is the recombination of excess conduction band electrons and valence band holes. At low current densities the electrons recombine with the holes, spontaneously emitting radiation in all directions. At higher currents an inverted population is created. Lasing action occurs when a light pulse makes a round trip between the front and rear surfaces within the waveguide without attenuation, and escapes from the front surface of the waveguide.

As in an LED (light emitting diode), in order to emit light, the pn junction is forward biased. Also, as in most semiconductor devices, operation is dependent upon junction temperature. As the junction temperature in a laser diode rises, light output decreases.

In a typical laser printer the laser emits light onto the electrophotographic drum for the white portions of the printed page, and is turned off for the dark portions of the printed page. The junction cools rapidly when turned off, such that after writing the "dark" portions of the pate, there will be a shadow effect on the next written white portion since it takes a finite amount of time for the junction to heat up. Conversely, this is not a problem in the other case because the laser diode is completely cut off in the write dark portions and therefore not sensitive to laser junction temperature.

Prior art attempts to overcome these disadvantages have only been partially successful. In one method known in the art, the laser is simply left on at all times; but, the amount of power to the laser is increased when it is desired to write a "white" area. This provides only a partial solution since the temperature of the junction still varies as the power to the laser is varied to write the white and black portions of a page. Further, this technique reduces the contrast of the printed page since the usable dynamic range of the laser diode is decreased. This is a particular disadvantage when writing graphics with a gray scale.

Another technique known in the art for reducing laser shadow is the use of feedback. A sensor is used to detect either laser light output or junction temperature and the power to the diode is adjusted accordingly. In a high speed, high resolution laser printer, however, each picture element ("pel") may have a write time of only about 50 nanoseconds (ns). Thus, feedback is not widely used because the circuitry generally available, at non-prohibitive prices, is not fast enough.

SUMMARY OF THE INVENTION

The present invention is directed to an apparatus and method for reducing laser shadow in a laser printer. In particular it accomplishes the reduction or elimination of the laser shadow by maintaining the junction temperature of the laser diode at a constant level. The constant temperature is maintained by a reverse or zener current through the laser diode when the laser is in an off state. The zener current is determined so that the product of the reverse laser current and reverse breakdown voltage is equal to the product of the forward bias voltage drop and forward current. Since these products are substantially equal to the power dissipated in the diode, equal amounts of power are dissipated as heat in the laser diode junction both when the laser is in a writing state and in a non-writing state. As a result, the junction temperature remains relatively constant and light output concomitantly remains constant when the laser is turned on.

It is thus an object of this invention to provide a laser printer that maintains the junction of the laser diode at a substantially constant temperature.

It is a further object of the present invention to provide a laser printer substantially free of laser shadow.

These and other objects, advantages and features of the invention will be more apparent upon reference to the attached specification and drawings.

DETAILED DESCRIPTION OF THE PREFERRED EMBODIMENTS

In order to eliminate laser shadow, the laser diode is fed and caused to dissipate substantially the same amount of power when it is both emitting radiation (on) and not emitting radiation (off). This is accomplished by recognizing that a laser diode, like any semiconductor diode, has both a forward voltage drop and a reverse voltage breakdown (zener voltage).

The forward voltage ($V_{fl}$) in a laser diode is generally in the region of 2 to 2.2 volts. A laser diode used in a laser printer can typically safely handle currents ($I_l$) in the range of 50 to 90 milliamperes (mA). The power dissipated by the laser diode when forward biased is thus in the range of approximately 100 to 200 milliwatts (mW). Most of this power is dissipated as thermal energy or heat by the laser diode, which in turn heats up the laser diode junction.

Typical laser diodes have a zener or reverse breakdown voltage ($V_{rl}$) in the range of 9 to 12 volts. If the reverse current is limited to the range 12 to 15 mA., power dissipated by the laser diode will once again be in the range of 100 to 200 mW. As in the forward biased case, virtually all of this power is generated as heat which can heat the laser diode junction.

Thus, in accordance with the present invention, in order to maintain constant heat generation in the laser diode, the following equation must be satisfied:

$$V_{fl} \times I_l = V_{rl} \times I_s' = P_l \qquad (1)$$

where $P_l$ is the power dissipated in the laser diode and the reverse current is denoted $I_s'$ for reasons explained below.

Figure 1:
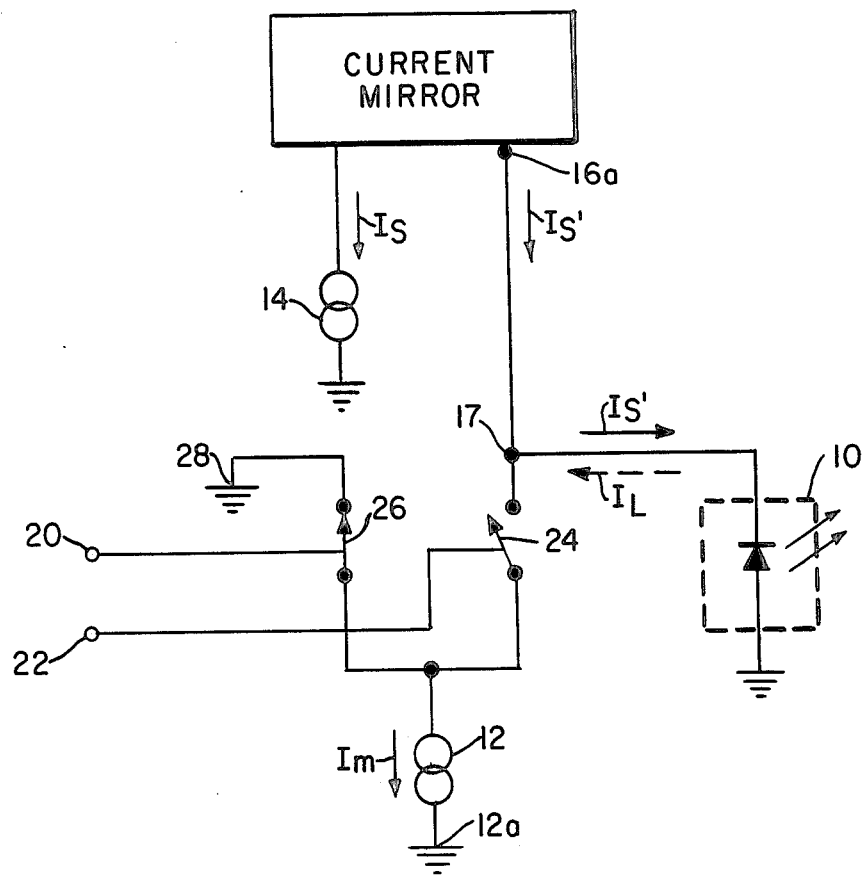
FIG. 1 is a block diagram of the a laser diode driver according to the present invention.

In FIG. 1 there is shown a block diagram of a laser driver according to the present invention. Laser diode 10 is driven so that it dissipates $P_l$ watts whether the laser diode is in the on or off condition. Constant current source 12 provides the main current $I_m$ to laser diode 10 when it is in the on condition. Shadow constant current source 14 provides a constant current that determines the current $I_s$ flowing through the reverse biased laser diode in the off condition. Current mirror 16 makes current $I_s'$ available at its output terminal 16a and at node 17. For the present discussion $I_s' = I_s$, however, as will be further explained below, $I_s'$ can be varied to provide additional desirable features in the laser driver of the present invention.

A signal is applied to terminals 20 and 22 which control whether laser diode 10 is in the on or off condition. This signal may be a difference signal, such that, for example, terminal 20 may be driven positive when terminal 22 is driven negative. In the on condition, switch 24 receives a signal from terminal 22 so that it is closed to permit the flow of current $I_m$ through the switch and into the main current source 12. At this time switch 26 will be held closed to prevent the flow of current through it. In accordance with Kirchoff's current law, the sum total of the current flowing into node 17 must be equal to the current flowing out of the node. Current $I_s'$ flows into node 17 from current mirror 16. Additionally, $I_m$ is chosen so that it is greater than $I_s'$ and flows from node 17 through switch 24 to ground at 12a. In this case since $I_m$ and $I_s'$ are constants the laser current $I_l$ is the difference between the main current and the shadow current, i.e.:

$$I_l = I_m - I_s' \qquad (2)$$

This current $I_l$ times the forward voltage drop across the laser diode will equal the power dissipated $P_l$.

In the off condition (shown in FIG. 1), switch 24 is opened and switch 26 closed so that current can flow through switch 26 but not switch 24. Main current $I_m$ will now flow through switch 26 to ground 28. Thus the current $I_m$ from main current source 12 does not affect $I_l$ and essentially goes to zero. Instead, the reverse current flows through the laser diode. Referring to equation 2 above, then:

$$I_l = -I_s' \qquad (3)$$

It will be noted from FIG. 1 that current $I_s'$ flows opposite to current $I_l$ and thus is negative in accordance with equation 3 above. The current $I_s'$ times the breakdown voltage of the laser diode is also made to equal the power dissipated $P_l$.

As is known, a current source will attempt to supply a constant current at any voltage up to the limits of its supply voltage. Thus, the supply voltage to constant current source 14 (and current mirror 16) must be chosen to be greater than the reverse breakdown voltage of the laser diode being used.

In the circuit, the difference between the forward voltage and the breakdown voltage depends on the laser diode selected. Thus, the main current and the shadow current are set such that the forward and reverse power dissipated is approximately the same.

Figure 2:
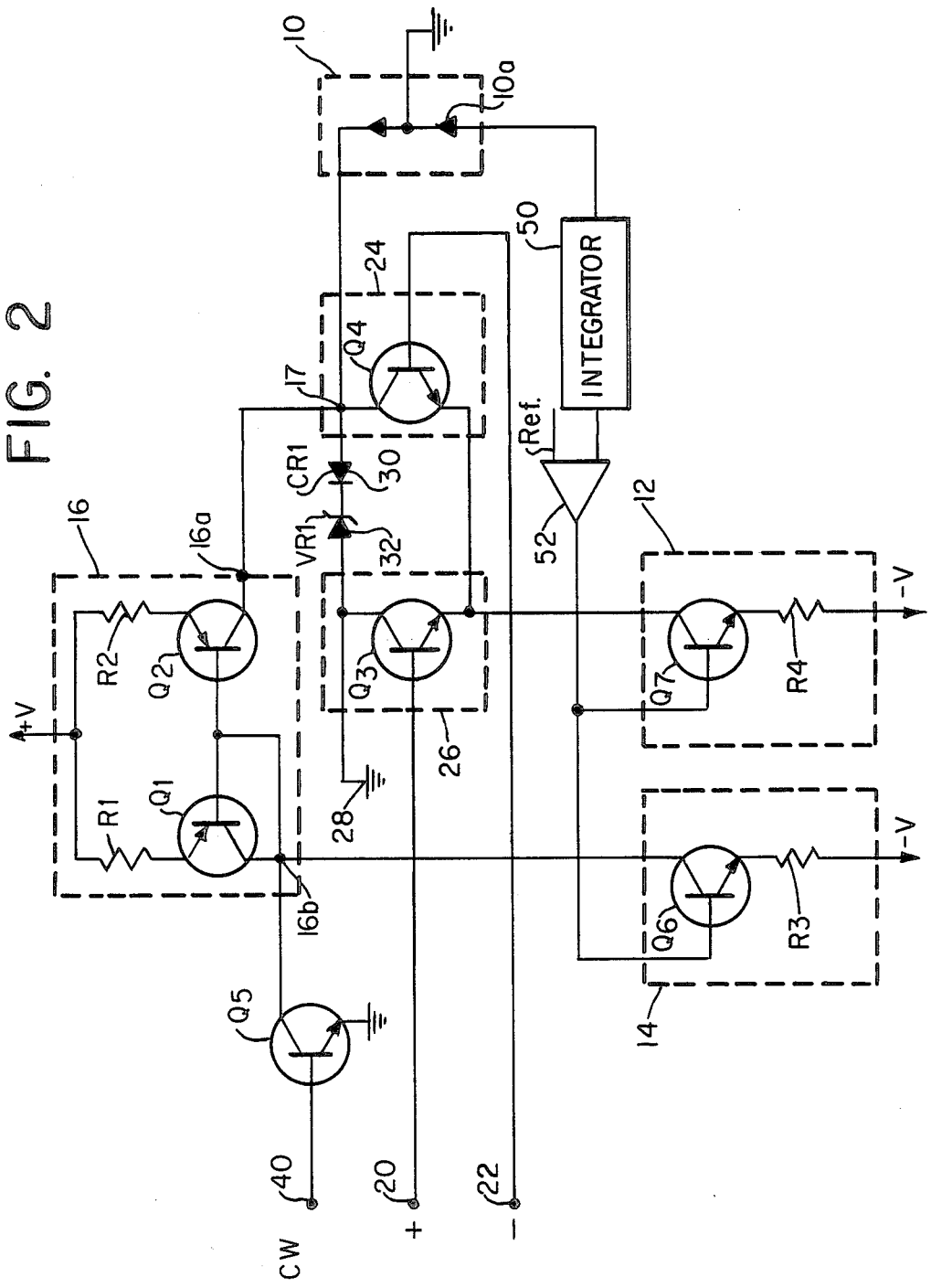
FIG. 2 is a schematic circuit diagram of a preferred embodiment of the laser diode driver according to the present invention.

FIG. 2 shows a more detailed schematic drawing of a preferred embodiment of the present invention. In FIG. 2 current mirror 16 comprises transistors Q1 and Q2 and resistors R1 and R2. Switches 24 and 26 are comprised of transistors Q4 and Q3, respectively, together with zener diode VR1 and diode CR1. Shadow current source 14 is comprised of transistor Q6 and resistor R3, while main current source 12 is comprised of transistor Q7 and resistor R4.

Transistors Q6 and Q7, and resistors R3 and R4, act as conventional current sources. The value of the current provided by these sources is dependent upon the values of resistors R3 and R4, the base-emitter bias of transistors Q3 and Q4, and the characteristics of transistors Q6 and Q7.

Transistors Q1 and Q2 of current mirror 16 function in the conventional manner to provide the same current at node 16a as is received at terminal 16b. Thus current received from the collected of transistor Q6 is "mirrored" at node 16a.

Transistor Q5 can inject additional current into node 16b in the continuous wave ("CW") mode. This mode is used during start up of the laser printer in order to establish levels. During this mode, the laser is turned on and is not modulated. However, in the CW mode it is necessary to lower the laser current to keep from saturating a start-of-line photodiode typically located next to the photoconductor drum. A CW signal is applied to input terminal 40. This turns on transistor Q5 and increases current $I_s$. According to equation (2), this reduces the current to the laser diode and prevents too much light from striking the start-of-line photodiode.

Transistors Q3 and Q4 function as switches 26 and 24. When the base emitter junctions of either transistor Q3 or Q4 is forward biased, the transistor is turned on and current flows through it to transistor Q7. As previously described, the current supplied to the laser diode depends upon which switch, transistor Q3 or Q4, is conducting current.

It will be noted that while node 17 is directly coupled to diodes 30 and 32, which are in turn coupled to ground 28 at the anode of diode 32, current does not flow to ground unless it is supplied at a voltage greater than the zener diode breakdown voltage across zener diode 32, plus the small forward voltage drop across diode 30. However, the voltage drop across the reversed-biased laser diode 10 is, as previously stated, approximately 9–12 volts. Therefore, the value of zener diode 32 plus the forward voltage drop of diode 30 must be chosen to be greater than 12 volts, e.g., 15 volts, so as not to interfere with the driver circuit during normal operation.

It should further be noted that current $I_s'$ does not flow through diodes 30 and 32 to ground unless the reverse voltage at which the current is supplied to the laser diode exceeds the combined forward voltage drop of diode 30 and zener voltage of zener diode 32. When this reverse breakdown voltage is exceeded, the diodes 30, 32 conduct and prevent excessive reverse voltage from being applied to the laser diode.

Laser diode 10 has a built in photodiode 10a that monitors the laser light output and is used to provide feedback for an automatic level control circuit (ALC). Photodiode 10a produces an electrical signal that is fed to an integrator 50 that produces a D.C. signal. This signal is compared to a reference in comparator 52 and the difference is coupled to the bases of both transistors Q6 and Q7, which in turn cause the current they supply to vary in direct correspondence to the D.C. bias supplied by the comparator. The current drawn by transistors Q6 and Q7 is therefore varied to compensate, for example, for environmental conditions that may change the laser diode light output, and the light output of the laser diode is accordingly kept constant.

In addition other signals may be used that vary the D.C. bias applied to transistors Q6 and Q7. For example, the signals used to compensate for the position and angle of the laser beam as it scans across the photoconductor, or variation of laser output in accordance with writing speed may also be easily introduced at the bases of transistors Q6 and Q7 to control the output of the laser diode 10.

The present invention thus provides an easily implemented, inexpensive circuit for eliminating laser shadow in a laser printer.

While the present invention has been particularly shown and described with reference to a preferred embodiment thereof, it will be understood by those skilled in the art that various changes in the form and details may be made therein without departing from the spirit and scope of the invention.

What is claimed is:

1. A laser diode driver for driving a laser diode on and off, said laser diode generating a beam of laser light when on and having a forward voltage level and a reverse breakdown voltage level, said laser diode driver comprising:
    means for providing a forward current through said laser diode such that said laser diode is on and the product of said forward current and said forward voltage level equals a particular power; and
    means for providing a reverse current through said laser diode such that said laser diode is off and the product of said reverse current and said reverse breakdown voltage is substantially the same as the particular power.

2. A laser diode driver according to claim 1 wherein said means for providing a forward current and said means for providing a reverse current comprise:
    a main constant current supply for providing a main current;
    a shadow constant current supply for providing a shadow current less than said main current, said shadow current supply being connected to said laser diode at a circuit node so as to supply the reverse breakdown voltage and the reverse current to said laser diode, and
    a switching means for selectively connecting said main constant current supply to the circuit node so as to supply the forward voltage level and the forward current to said laser diode such that the forward current is the difference between the main current and the shadow current, said switching means acting to turn on said laser diode with the forward current when said switching means connects said main constant current supply to the circuit mode and to turn off said laser diode with the reverse current when said switching means disconnects said main constant current supply from the circuit node.

3. The apparatus according to claim 2 wherein the light output of said laser diode, when it is on, is controlled by a compensation signal that controls at least one of said main constant current supply and shadow constant current supply.

4. The apparatus according to claim 3 further including a recording medium sensitive to the laser beam and wherein the compensation signal is a signal related to the angular position of the laser beam with respect to the recording medium.

5. The apparatus according to claim 2 further comprising a current mirror coupled between said reverse current source and said laser diode for providing a current representative of said reverse current to said laser diode at the circuit node.

6. The apparatus according to claim 2 for driving said laser diode with an information representative signal, wherein said switching means comprises first and second switches, each having first, second and third terminals, the first terminals being coupled to said main current source, the second terminal of said first switch being coupled to ground for conducting current to ground when closed, the second terminal of said second switch being coupled to said laser diode at the circuit node for conducting current therefrom when closed, and said switches being closed or open in response to signals at the third terminals of said switches; and
    wherein said information representative signal comprises a difference signal coupled across the third terminals of said first and second switches.

7. The apparatus according to claim 6 wherein said first and second switches comprise first and second transistors.

8. The apparatus according to claim 7 further including a zener diode coupled between the second terminals of said first and second switches, said zener diode having a zener voltage greater than said laser diode reverse breakdown voltage.

9. A laser printer having a photosensitive medium, means for receiving an information signal representative of information to be printed on said medium, a laser diode for generating a beam of laser diode light incident on said medium, said laser diode having a forward voltage and a reverse breakdown voltage, and a laser diode driver for controling the laser light in response to the information signal, said laser diode driver comprising:
    first current source means coupled to said laser diode for providing a reverse current to said laser diode, said reverse current having a value such that the product of said reverse current and said reverse breakdown voltage of said laser diode equals a particular power dissipation;

second current source means for providing a main current greater than said reverse current;

switching means having a first terminal coupled to said second current source means and a second terminal coupled to said laser diode for switchably coupling current received from said second current source to said laser diode to forward bias said laser diode, said current switch being responsive to said information representative signal, current to said laser diode being a forward current equal to the algebraic sum of said first and second constant currents when said switching means is closed, and being said reverse current when said switching means is open, said laser diode being forward biased when said switching means is closed and reverse biased when said switching means is open, and the product of said forward current and said forward voltage being substantially equal to said particular power dissipation.

10. The apparatus according to claim 9 further comprising a current mirror coupled between said first current source and said laser diode for providing a current representative of said first current to said laser diode.

11. The apparatus according to claim 10 wherein said switching means comprises first and second switches, each having first, second and third terminals, the first terminals being coupled to said second current source, the second terminal of said first switch being coupled to ground for conducting current thereto when closed, the second terminal of said second switch being coupled to said laser diode for conducting current thereto when closed, and said switches being closed or open in response to signals at the third terminals of said first and second switches; and wherein said information representative signal comprises a difference signal coupled across the third terminals of said first and second switches.

12. The apparatus according to claim 11 wherein said first and second switches comprise first and second transistors.

13. The apparatus according to claim 12 further including a zener diode coupled between the second terminals of said first and second switches, said zener diode having a zener voltage greater than said laser diode reverse breakdown voltage.

14. A method for reducing laser shadow in a laser printer having a laser diode with a forward voltage and a reverse breakdown voltage, comprising the steps of:

passing a reverse current through said laser diode when it is off such that the product of the reverse current and said reverse breakdown voltage is a particular power; and passing a forward current through said laser diode when it is on such that the product of said forward current and said forward breakdown voltage is substantially the same as said particular power.

* * * * *